(12) United States Patent
Meyer

(10) Patent No.: US 10,587,983 B1
(45) Date of Patent: Mar. 10, 2020

(54) METHODS AND SYSTEMS FOR ADJUSTING CLARITY OF DIGITIZED AUDIO SIGNALS

(71) Applicant: Ronald L. Meyer, Parker, TX (US)

(72) Inventor: Ronald L. Meyer, Parker, TX (US)

(*) Notice: Subject to any disclaimer, the term of this patent is extended or adjusted under 35 U.S.C. 154(b) by 0 days.

(21) Appl. No.: 16/152,251

(22) Filed: Oct. 4, 2018

Related U.S. Application Data

(60) Provisional application No. 62/568,223, filed on Oct. 4, 2017.

(51) Int. Cl.
| | | |
|---|---|---|
| *H04S 7/00* | (2006.01) | |
| *H04R 5/04* | (2006.01) | |
| *H03G 11/00* | (2006.01) | |
| *H03G 3/30* | (2006.01) | |
| *H03G 7/00* | (2006.01) | |

(52) U.S. Cl.
CPC .......... *H04S 7/307* (2013.01); *H03G 3/3089* (2013.01); *H03G 7/007* (2013.01); *H03G 11/008* (2013.01); *H04R 5/04* (2013.01)

(58) Field of Classification Search
CPC . H04S 7/307; H04R 5/04; H03G 5/00; H03G 5/005; H03G 5/025; H03G 3/3089; G03G 7/007; G03G 11/008; G10L 21/0232
USPC .............. 381/94.2, 94.3, 98, 101, 102, 104
See application file for complete search history.

(56) References Cited

U.S. PATENT DOCUMENTS

| | | | | |
|---|---|---|---|---|
| 6,081,777 A * | 6/2000 | Grabb | ................. | G10L 21/0364 704/205 |
| 8,724,828 B2 * | 5/2014 | Furuta | .................... | H04R 3/002 327/551 |
| 8,842,853 B2 * | 9/2014 | Vandali | ............... | G10L 21/0205 381/98 |
| 8,885,845 B2 * | 11/2014 | Honji | ..................... | G10K 15/04 381/102 |
| 2005/0069153 A1 * | 3/2005 | Hall | ....................... | H03G 5/025 381/103 |
| 2006/0062405 A1 * | 3/2006 | McKee Cooper | ...... | G01S 11/14 381/103 |
| 2012/0008809 A1 * | 1/2012 | Vandali | ............... | G10L 21/0205 381/317 |
| 2012/0148066 A1 * | 6/2012 | Honji | ..................... | G10K 15/04 381/86 |
| 2013/0138434 A1 * | 5/2013 | Furuta | ................. | G10L 21/0208 704/226 |
| 2015/0263871 A1 * | 9/2015 | Terada | .................... | H04L 27/01 375/232 |

* cited by examiner

*Primary Examiner* — William A Jerez Lora
(74) *Attorney, Agent, or Firm* — Seth A. Horwitz; Carrington, Coleman, Sloman & Blumenthal, L.L.P.

(57) ABSTRACT

In described examples, a method of processing an audio program material includes converting the audio program material into a frequency domain audio program material; increasing or decreasing an energy amplitude of one or more energy troughs in an audio data sample in the frequency domain audio program material, ones of the energy troughs being located between respective ones of one or more pairs of adjacent energy peaks in the audio data sample, the pairs of adjacent energy peaks selected to correspond to frequencies of sounds which were captured to create the audio program material; repeating the increasing or decreasing step for multiple audio data samples in the frequency domain audio program material; and converting the frequency domain audio program material into a time domain audio program material.

14 Claims, 12 Drawing Sheets

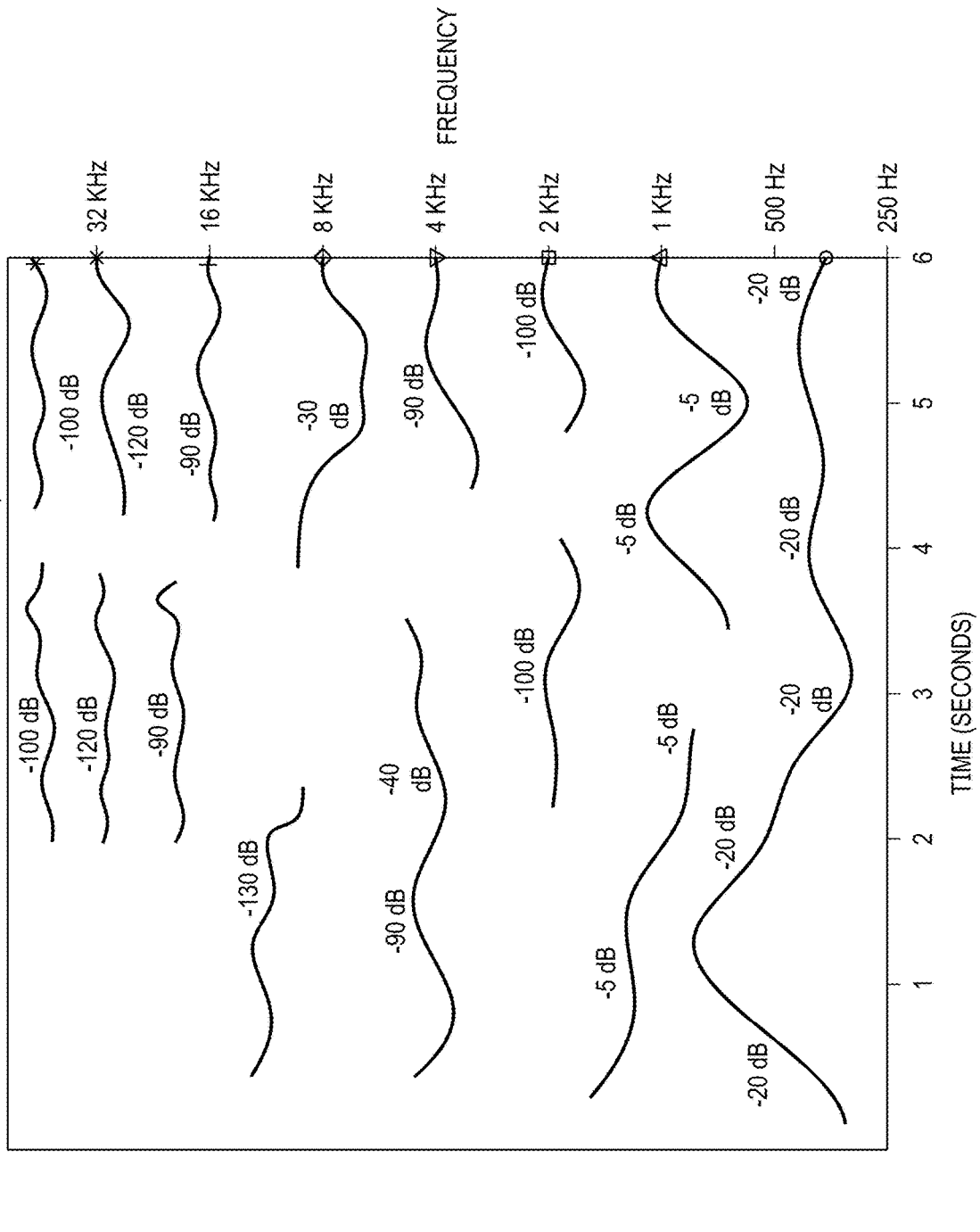

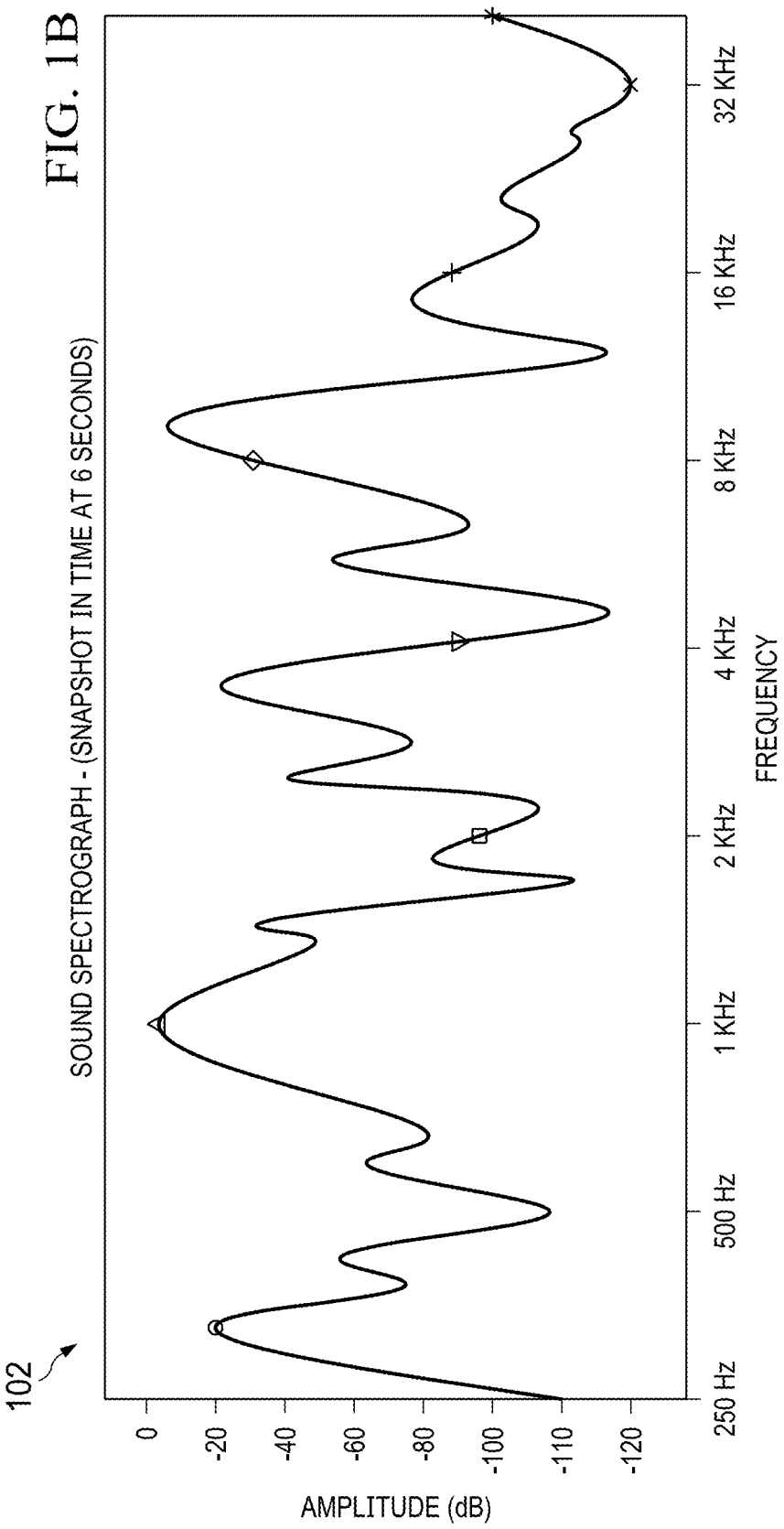

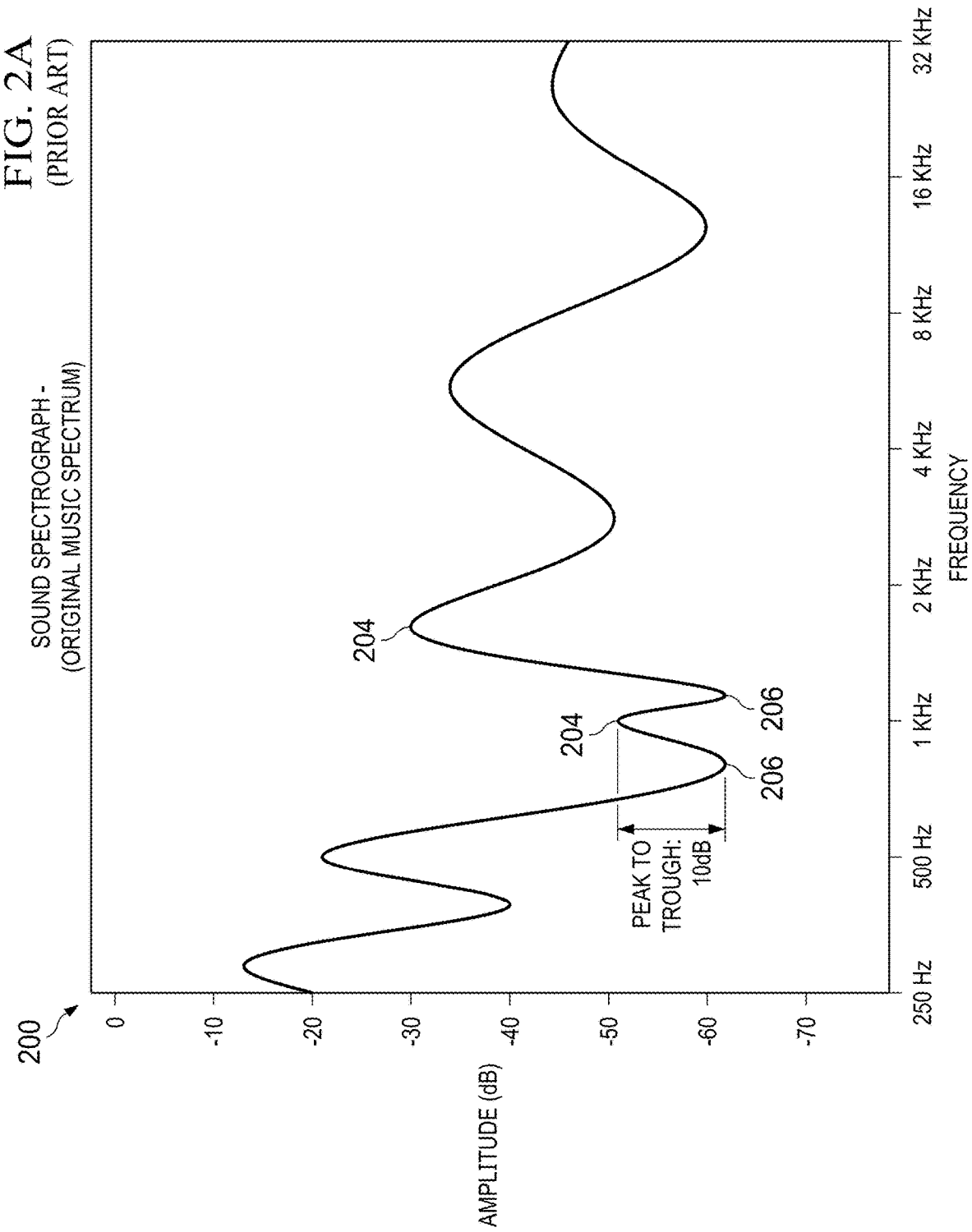

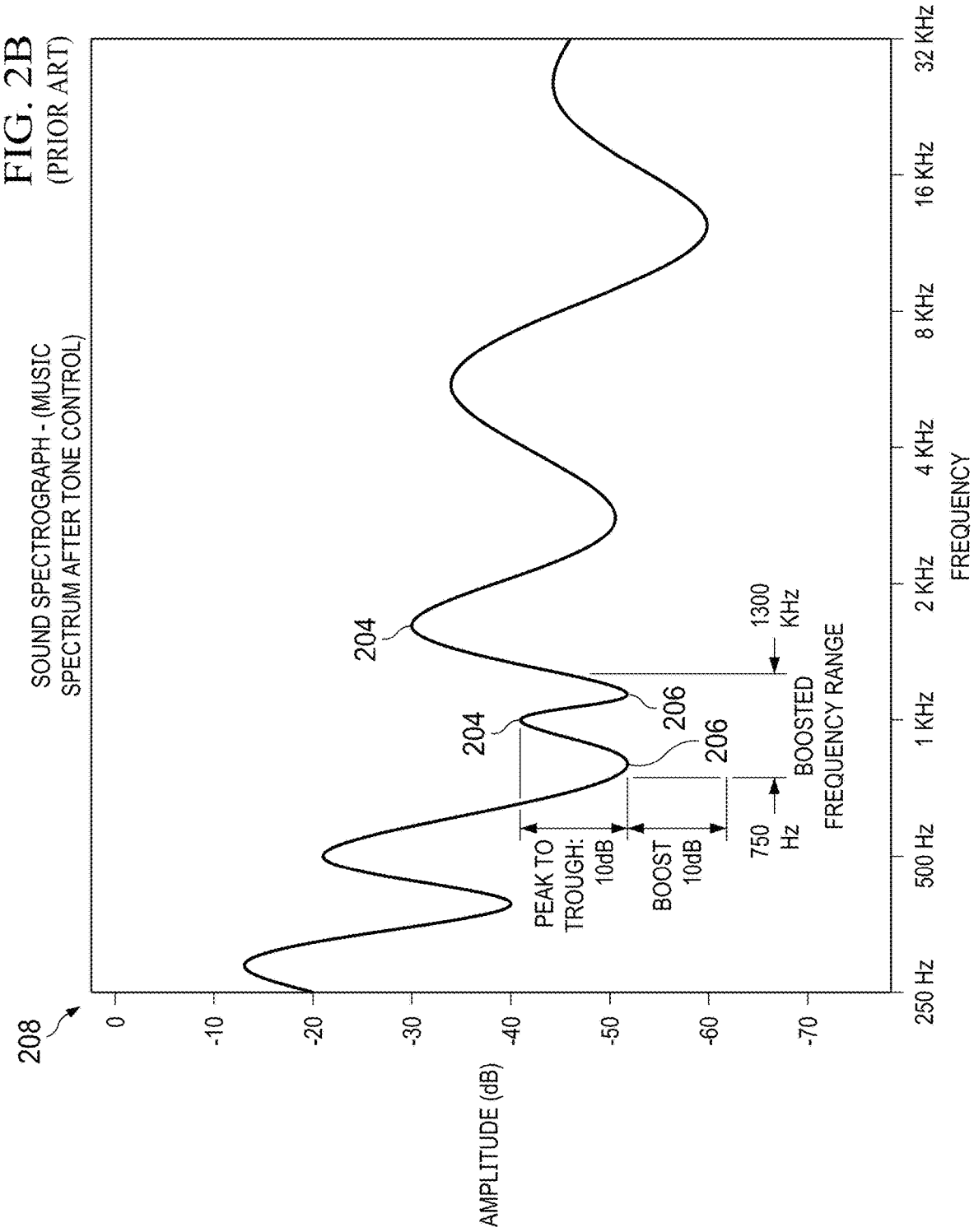

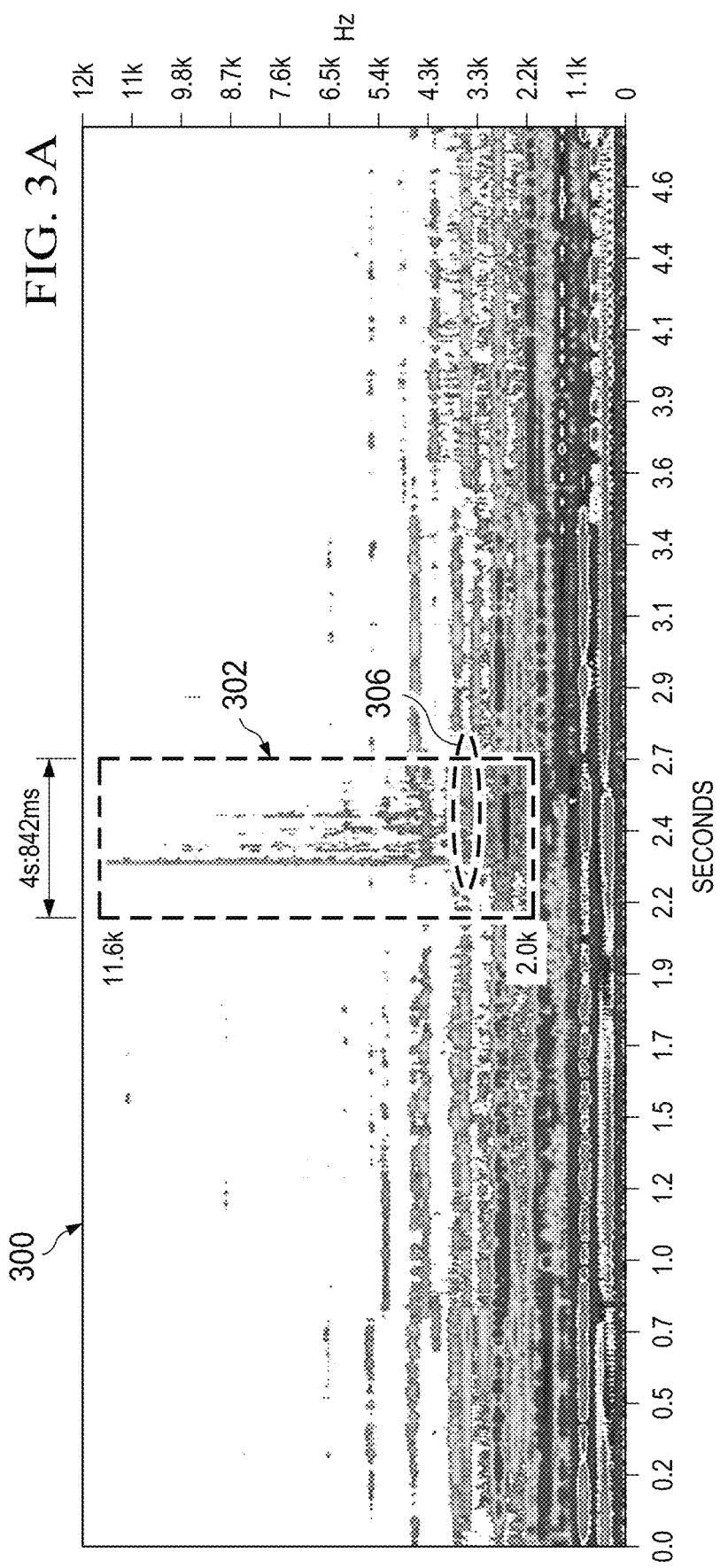

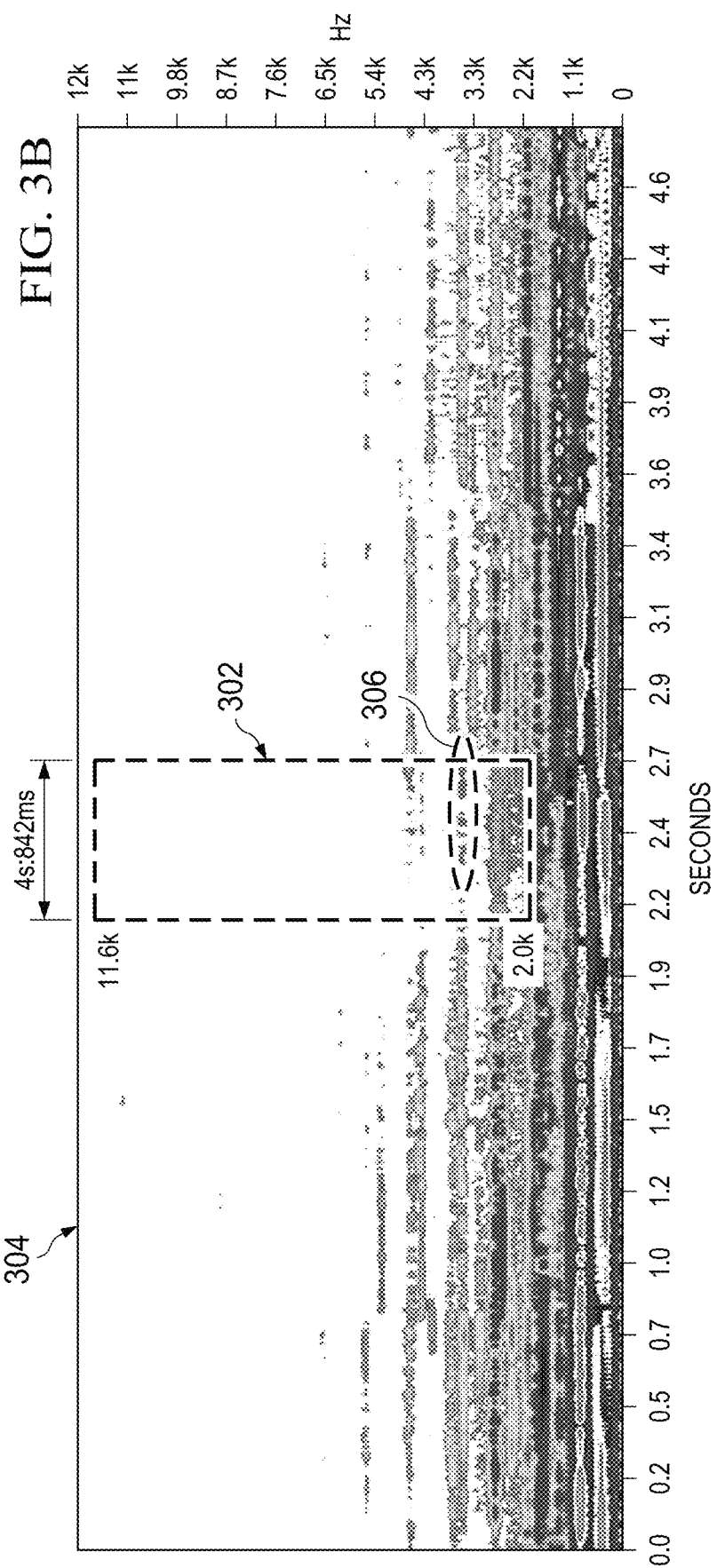

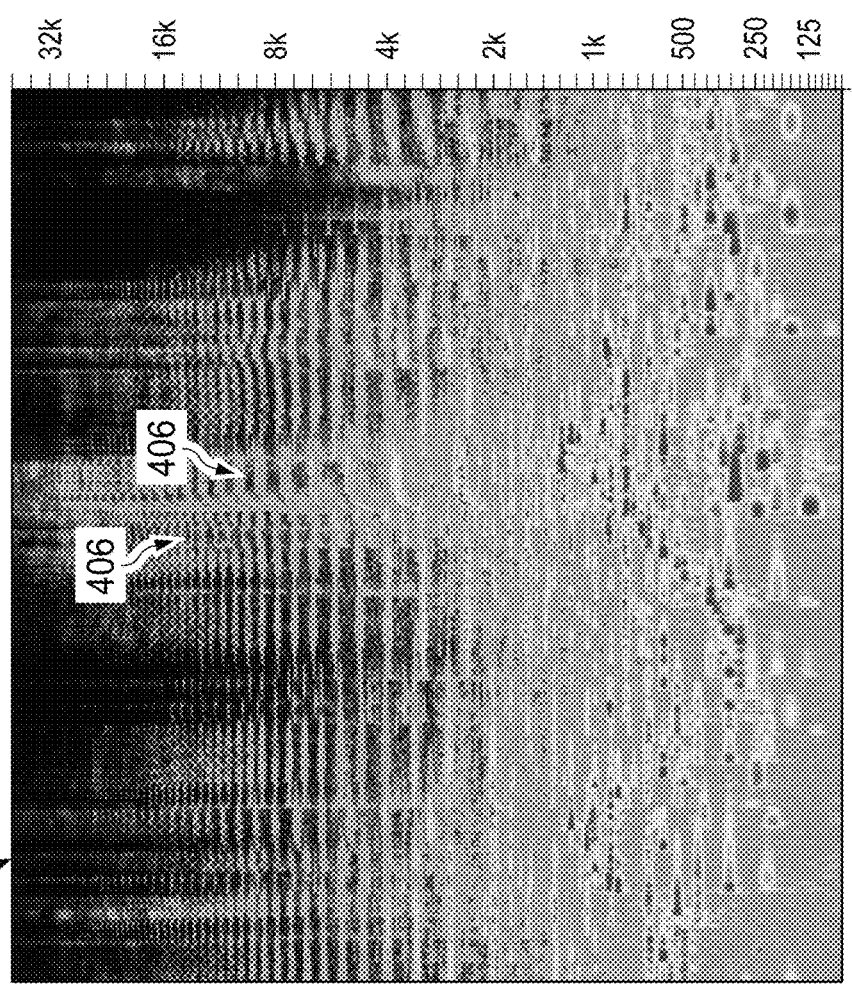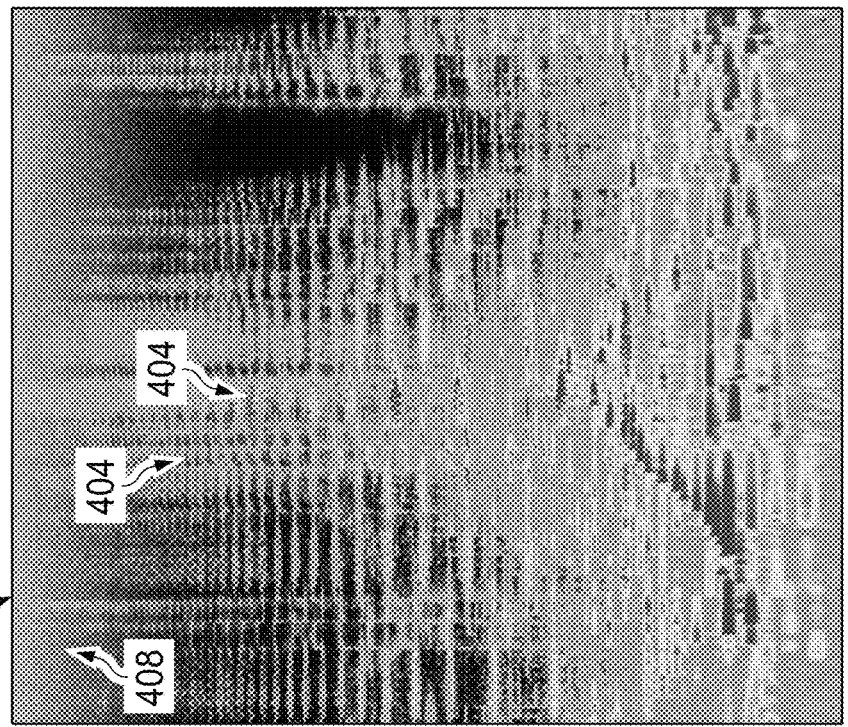

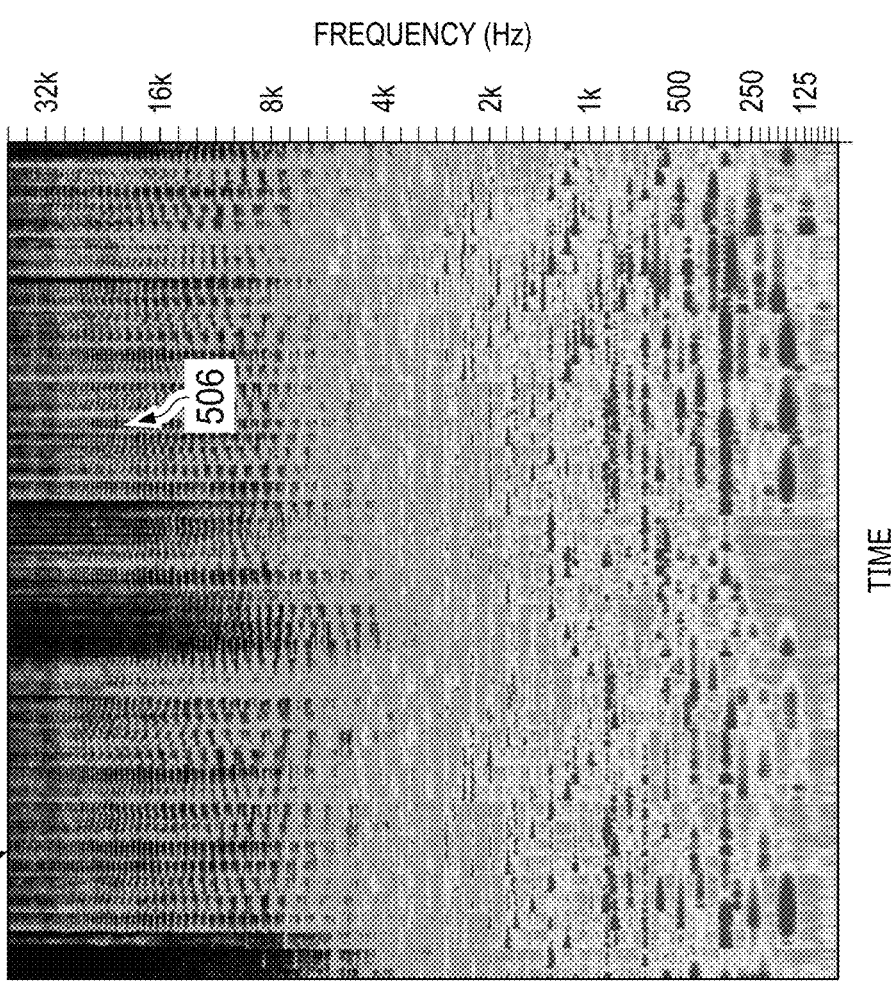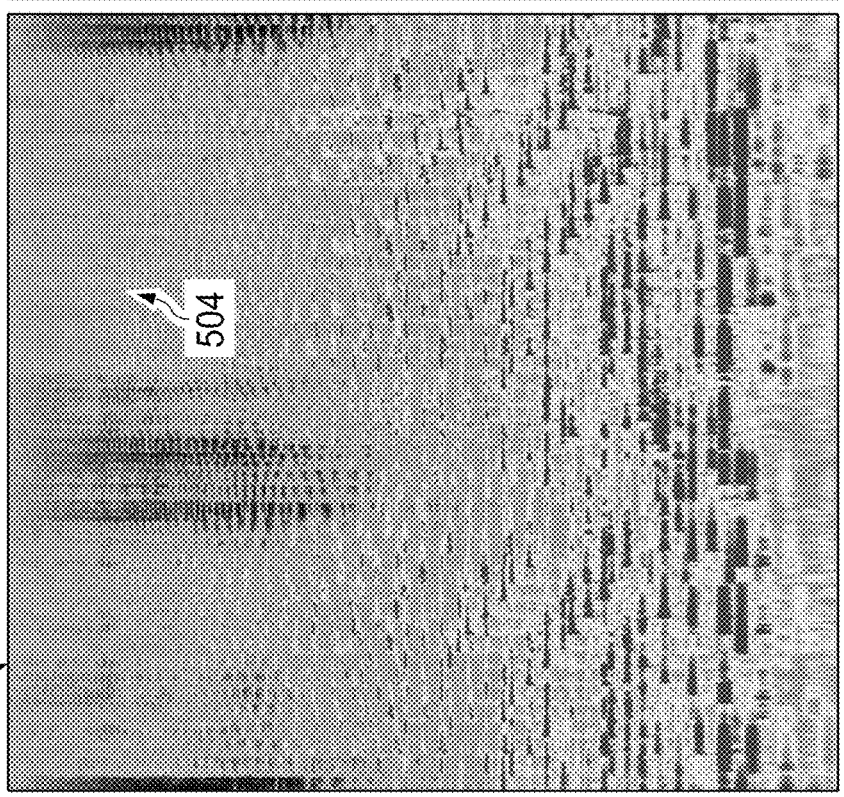

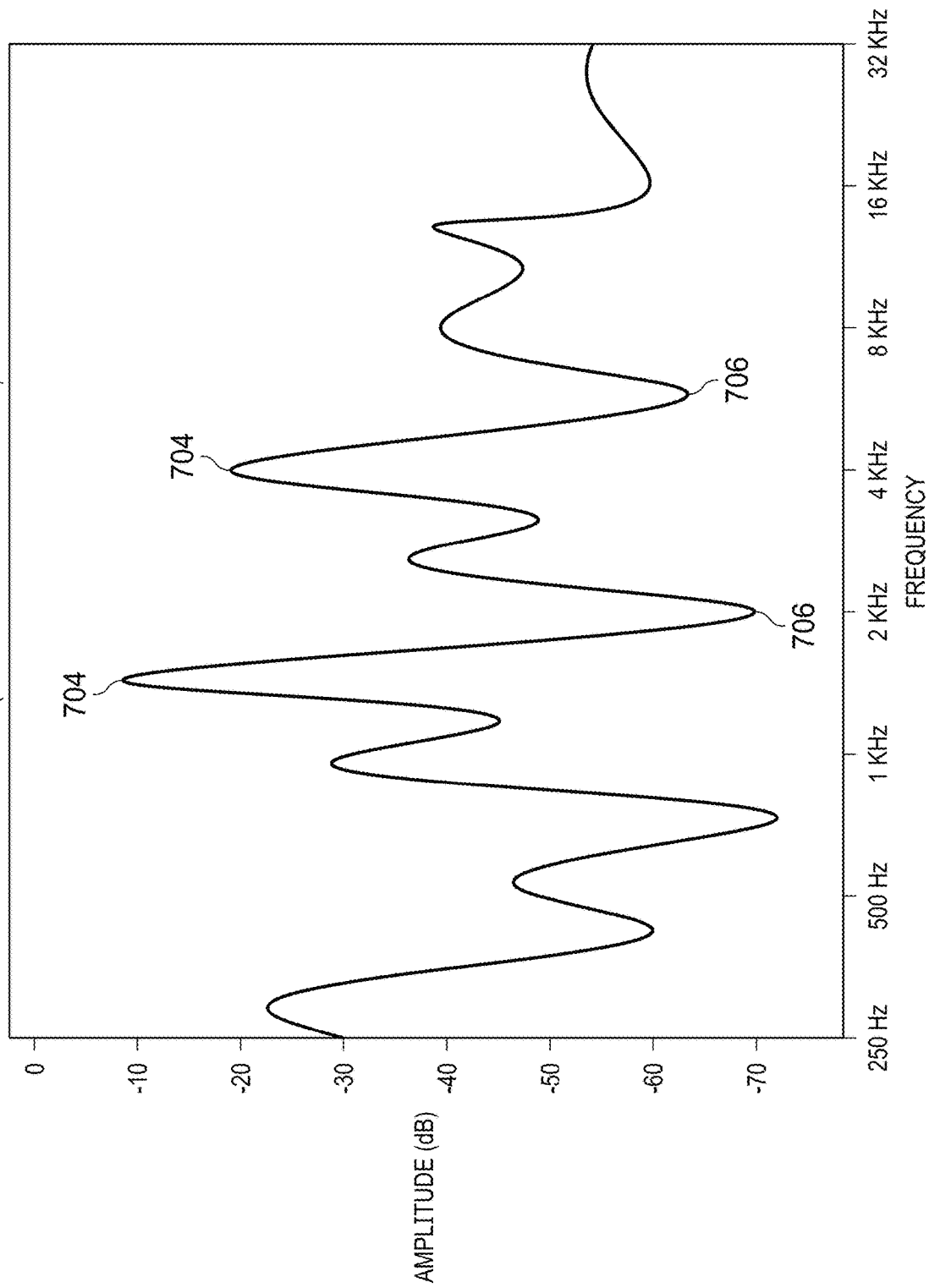

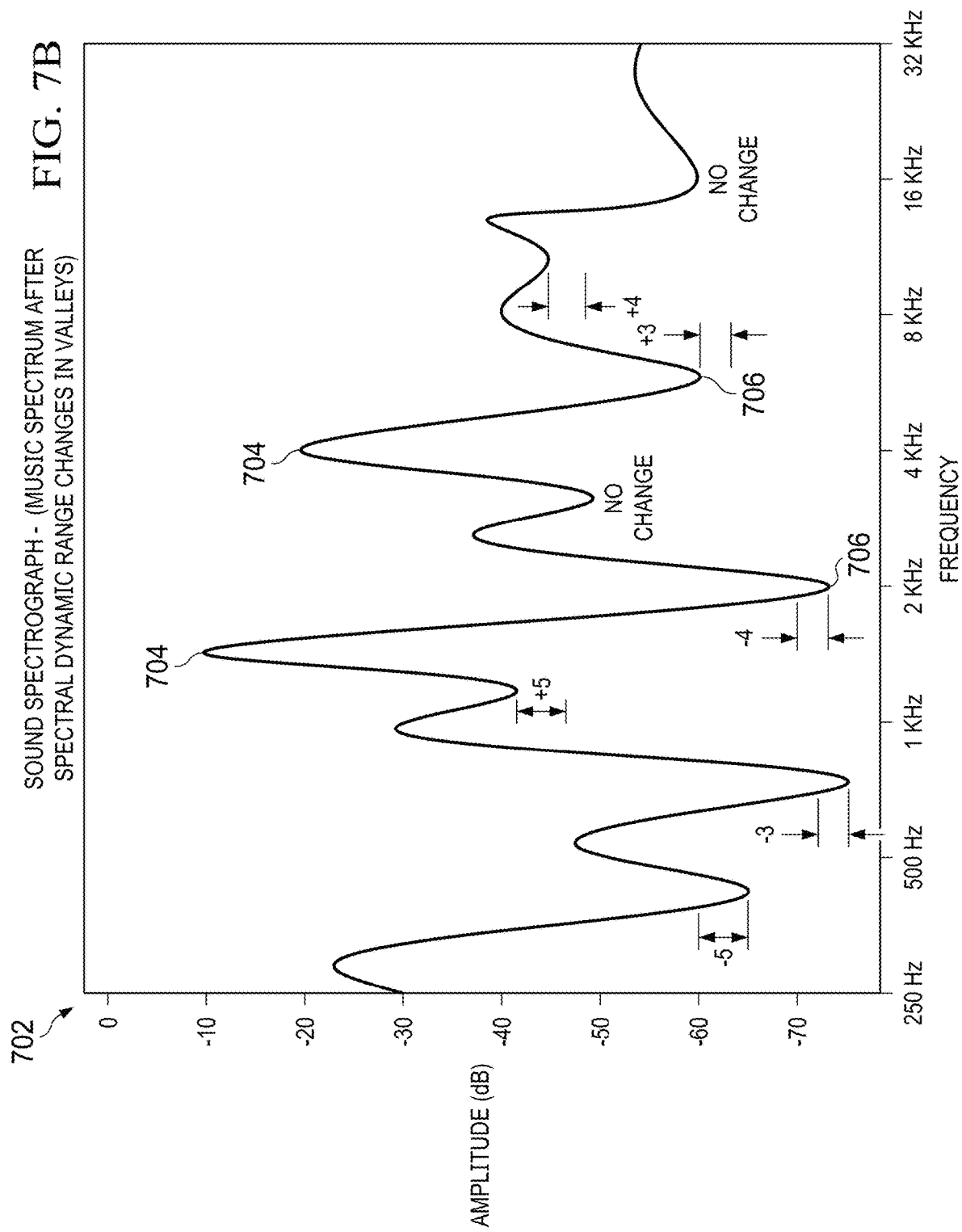

METHODS AND SYSTEMS FOR ADJUSTING CLARITY OF DIGITIZED AUDIO SIGNALS

CROSS-REFERENCE

This application is a non-provisional of, and claims priority to, U.S. Provisional Pat. App. No. 62/568,223, filed on Oct. 4, 2017.

BACKGROUND

The present application relates to capture and processing of digital audio signals, and more particularly to adjusting clarity of digital audio signals during and after signal capture.

Note that the points discussed below may reflect the hindsight gained from the disclosed inventive scope, and are not necessarily admitted to be prior art.

Generally, audio recordings, audio amplifiers, and audio signal processing, whether of high or low resolution, do not accurately reflect the original dynamic range, transient response, and frequency balance of the sound(s) they were intended to capture, stream and/or amplify. This is because components in the audio capture/processing chain generally are not "ideal" examples of their class of component (much as, contrary to "ideal" assumptions in certain physics calculations, air is not frictionless). As a result, recorded or captured/streamed audio contains unintended low level distortion byproducts. The audio industry is aware of this situation, and uses equipment, recording techniques, and audio signal processing steps to compensate. Common wisdom has held that these steps have been successful in compensating for known sources of distortion, especially with respect to high resolution audio. However, some listeners can hear consistent remaining distortion in typical recording products. (Some listeners cannot hear this distortion. Some listeners can hear this distortion and find it unpleasant, while others find it pleasant or are not bothered by it.)

Some listeners are aware of remaining distortion-related shortcomings in captured and computer-generated music, while other listeners do not hear such degradation. This is because different people possess different levels of ability to hear "spectral dynamic range"-related distortion, an unwanted by-product of the typical audio recording/capture chain. "Spectral dynamic range" is defined and further described hereinbelow.

The audio recording industry recognizes that the various elements of the audio recording and/or signal processing chain have limitations, and has attempted to compensate for the recognized shortcomings in (for example) audio amplifier circuits, audio digital to analog converters and analog to digital converters, computer processing, and playback equipment. To do so, the audio industry has employed various techniques.

To correct distortion and make other desired changes to an audio program material, audio engineers typically utilize, for example:

a) Multiple microphone recording techniques, in which each instrument's sound is captured with one or more microphones dedicated to that instrument. This means the microphones used for each instrument pick up the sounds of the desired instrument, as well as lower level (e.g., lower amplitude and distorted) versions of sounds from the other instruments and/or voices in the ensemble (which have their own microphone(s)). The lower level sounds of instruments not corresponding to a particular microphone are generally undesired, and add low level distortion to the recorded (or otherwise captured) sounds.

b) Various types of audio signal processing approaches, implemented using hardware or software. Some audio signal processing techniques used by audio engineers to compensate for noise and/or distortion in audio program material (a recorded, computer-generated, or otherwise captured set of audio data) use "tune control". Tune control raises or lowers the amplitude of audio program material over a frequency range, and can be readily described using sound spectrographs.

FIG. 1A shows an example of a sound spectrogram 100 of an audio program material. A sound spectrogram is a visual representation of a spectrum of audio frequencies as they vary with time, and corresponds to a time history of many spectrographs. A sound spectrogram can be created from a digital audio program material using a transformation from a time domain to a frequency domain, such as a Fourier transform. For simplicity and clarity, the spectrogram of FIG. 1 shows only some of the frequency information of the corresponding signal. FIGS. 4A, 4B, 5A, 5B, 6A, and 6B are examples of sound spectrograms of live-recorded audio program material.

FIG. 1B shows an example of a sound spectrograph 102 of one moment in time of the audio program material of FIG. 1A. A sound spectrograph 102 shows amplitude information for a range of audio frequencies at a moment in time. The identified data points at particular frequencies (different shapes) in FIG. 1B correspond to the identified data points at the same frequencies (corresponding shapes) in FIG. 1A.

FIG. 2A shows an example of a sound spectrograph 200 of an audio program material. A particular frequency range 202, 750 Hz to 1300 Hz, is selected in FIG. 2A for modification using tone control. The selected frequency range 202 has an amplitude of 10 dB from peak 204 to trough 206 (the peak 204 has an amplitude of about −52 dB, and the troughs 206 have an amplitude of about −62 dB).

FIG. 2B shows a prior art example of a sound spectrograph 208 of the audio program material of FIG. 2A, after application of tone control. In FIG. 2B, tone control has been used to raise the amplitude of the selected frequency range 202 (750 Hz to 1300 Hz) by 10 dB, while preserving the 10 dB peak-to-trough amplitude range. (However, note that the peak-to-trough frequency range for adjacent peaks 204 is decreased by tone control.)

Typical audio signal processing techniques include:

1) Audio compression, also called dynamic range limiting, uses tone control to artificially reduce the amplitude difference between the lowest-amplitude sounds and the highest-amplitude sounds. This is generally done in an attempt to maximize perceived loudness. Typically, use of dynamic range limiting is related to the belief (generally erroneous) that compressing the audio dynamic range (the difference between a frequency range's maximum amplitude and its noise floor) to a minimum, then boosting the level of all of the audio program material (that is, increasing the amplitude of all sounds in the audio program material), will result in the most perceived loudness. This does not take into account the distinction between level and volume (level corresponds to measurable/objective amplitude, in contrast to volume, which corresponds to perceived amplitude).

2) Frequency equalizers use tone control to boost or reduce audio levels in selected portions of the frequency range of an audio signal. This is used, for example, to achieve a desired "sound" (a characteristic tonal balance of the audio signal) of the resultant audio that may be purposely different than the original (i.e., deliberately distinct from the natural, as-produced sound prior to capture), or to increase vocal presence by boosting voice content over music by emphasizing a frequency range containing significant human vocal content.

3) Transient "restorers", which are generally used to compensate for the fact that compression and equalization tend to significantly reduce the original transient response, which reduces the perceived "naturalness" of the resultant sound. However, use of artificial means to emulate the original transient attacks tends to further alter and degrade the original frequency, amplitude and phase relationships within the content of the audio signal.

4) Pre-adjustment of the sound, which is generally used to adjust some aspects of the frequency response to compensate ahead of time for playback on less than optimal quality reproduction equipment (e.g., speakers, headphones, computer and/or cell phone speakers, and earbuds). Whether or not a listener will consider the result an improvement in audio quality may depend on, for example, whether they are listening using equipment included in a sound adjuster's "target audience." That is, optimal pre-adjustment is generally different for different sound reproduction (playback) equipment. (There is an assumption herein that "optimal" adjustment of a sound recording is typically—though not always, depending, in part, on listener preferences and an intended character of the sound recording after processing, on playback—an adjustment that most closely reproduces the sound (the series of pressure waves) which was recorded.)

5) "Spectral repair" is used to remove sounds in a selected time window of audio program material. Spectral repair uses an interpolation of selected areas on a spectrogram (typically, including sounds from before and after the sounds to be removed) to fill in, or fully or partially replace, sounds to be removed. This is similar to using an image processing tool to cover a blemish in an image with a pattern derived from a similar portion of the image. FIG. 3A shows an example of a sound spectrogram 300 of an audio program material. The sound spectrogram 300 includes an undesired transient sound 302 (the sudden, broad-spectrum energy peaks within the box), such as the sound of a dropped book. FIG. 3B shows an example of a prior art sound spectrogram 304 of the audio program material of FIG. 3A on which spectral repair has been performed. (FIGS. 3A and 3B are greyscale images generated from color spectrograms, in which color indicated amplitude.) To perform the spectral repair, sounds near the blemished region are used to interpolate predicted sounds for the blemished region. The interpolated sounds are then substituted for the undesired transient sound 302. In FIG. 3B, the amplitude of the undesired transient sound 302 has been reduced to (or near) zero. However, comparison of FIGS. 3A and 3B shows that some sounds which appear to have been part of the as-performed audio program material (for example, item 306) have reduced amplitude after spectral repair. That is, spectral repair can (and generally will) result in a loss of fidelity.

The net result of using some or all of the above-described audio processing techniques is typically music or audio with significantly diminished resemblance to the original audio, and which is lacking in dynamic range, transient response, and natural sound quality. As a result, processed sound tends not to realistically emulate the original audio material.

The inventor endeavors to disclose new and advantageous approaches to adjusting clarity of captured, streaming and other digitized audio signals.

SUMMARY

In described examples, a method of processing an audio program material includes converting the audio program material into a frequency domain audio program material; increasing or decreasing an energy amplitude of one or more energy troughs in an audio data sample in the frequency domain audio program material, ones of the energy troughs being located between respective ones of one or more pairs of adjacent energy peaks in the audio data sample, the pairs of adjacent energy peaks selected to correspond to frequencies of sounds which were captured to create the audio program material; repeating the increasing or decreasing step for multiple audio data samples in the frequency domain audio program material; and converting the frequency domain audio program material into a time domain audio program material.

Numerous other inventive aspects are also disclosed and claimed.

BRIEF DESCRIPTION OF THE DRAWINGS

The disclosed inventive scope will be described with reference to the accompanying drawings, which show important sample embodiments and which are incorporated in the specification hereof by reference, wherein:

FIG. 1A shows an example of a sound spectrogram of an audio program material.

FIG. 1B shows an example of a sound spectrograph of one moment in time of the audio program material of FIG. 1A.

FIG. 2A shows an example of a sound spectrograph of an audio program material.

FIG. 2B shows a prior art example of a sound spectrograph of the audio program material of FIG. 2A, after application of tone control.

FIG. 3A shows an example of a sound spectrogram of an audio program material.

FIG. 3B shows an example of a prior art sound spectrogram of the audio program material of FIG. 3A on which spectral repair has been performed.

FIG. 4A shows an example of a spectrogram (frequency domain analysis) of a prior art recording of an audio program material.

FIG. 4B shows an example of a spectrogram of a recording of the same audio program material as in FIG. 4A.

FIG. 5A shows an example of a spectrogram (frequency domain analysis) of a prior art recording of a relatively high energy amplitude (high level) audio program material.

FIG. 5B shows an example of a spectrogram of a recording of the same audio program material as in FIG. 5A.

FIG. 7A shows an example of a sound spectrograph of an audio program material.

FIG. 7B shows an example of a sound spectrograph of the audio program material of FIG. 7A after ASDR adjustment.

DETAILED DESCRIPTION OF SAMPLE EMBODIMENTS

Figure 6B:
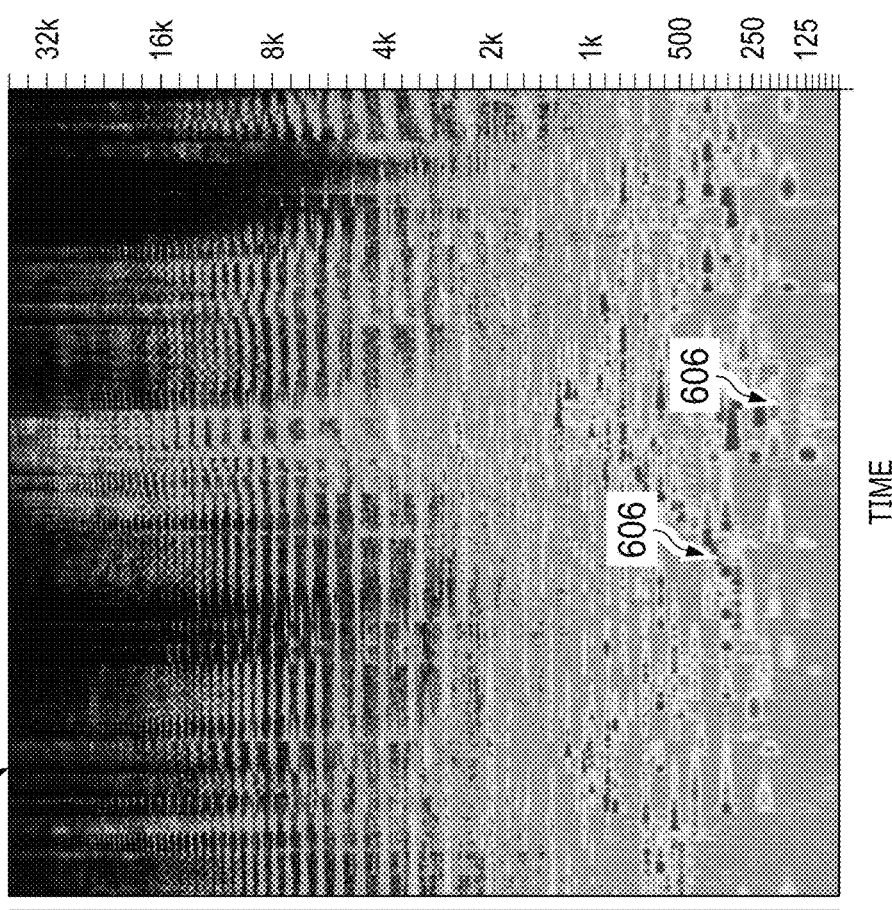
FIG. 6B shows an example of a spectrogram of a recording of the same audio program material as in FIG. 6A.

The numerous innovative teachings of the present application will be described with particular reference to presently preferred embodiments by way of example, and not of limitation. The present application broadly describes inventive scope, and none of the statements below should be taken as limiting the claims generally.

The present application discloses new approaches to capturing digital audio signals and improving and/or adjusting clarity of captured digital audio signals.

Some exemplary parameters will be given to illustrate the relations between these and other parameters. However it will be understood by a person of ordinary skill in the art that these values are merely illustrative, and will be modified by scaling of further device generations, and will be further modified to adapt to different materials or architectures if used.

"Energy peaks" or "audio spectral peaks" of a signal are defined herein as the frequencies (e.g., as shown by a spectrograph or spectrogram) in a given digitized audio sample set (e.g., one second's worth of audio material converted at a sample rate of 44,100 samples per second) which are captured (or otherwise present) at a significantly higher amplitude than nearby frequencies at that time mark in that signal.

In capturing and processing digital audio signals to a specified level of clarity, it is advantageous to recognize that: a) the low level energy in the frequency domain in between the energy peaks of an audio signal is at least partially responsible for the perceived 'audio clarity' or clearness of the audio signal; and b) different people possess different levels of the ability to distinguish clarity in audio material. Adjusting the amount of low level energy in the frequency domain between energy peaks, intelligibility, clarity, natural dynamic range and transient response can be preserved or improved, thereby enhancing a realistic quality of the sound and improving the illusion of realness of the sound.

Some listeners are sensitive to the distortion added by recording and/or processing that do not take into account this low energy noise. Listeners sensitive to this distortion can detect subtle changes in the audio spectrum energy, including in the low level energy between the peak energy sections in the frequency domain of music or other audio program material.

Audio Spectral Dynamic Range (ASDR) is a measure of the quality of an audio signal in light of this low energy noise. ASDR is a frequency domain measurement, preferably being calculated over each frequency octave over time. (In some embodiments, ASDR can be calculated over other frequency ranges of interest.) ASDR can be thought of as analogous to the radio frequency sensitivity measurement SINAD; ASDR similarly relates signal power to noise and distortion power in the frequency domain of an audio signal.

"Audio Spectral Dynamic Range" (or "ASDR") is defined herein as follows: ASDR=((energy of the signal)+(energy of the noise)+(energy of the distortion))/((energy of the noise)+(energy of the distortion)). ASDR measures the difference between the levels of the main energy components of the audio signal (which also include the noise and the distortion by-products) and the remaining energy 'in between' the signal peaks, made up of low level desired signals, noise, and unwanted distortion. This type of measurement provides an indication of how much stronger the main audio signal components are than the remaining parts of the audio program material (in between the energy peaks), and indicates the overall clarity and accuracy in the captured and/or reproduced signal.

Generalizations can also be made for smoothed or integrated data sets over time, and an average taken across some or all octaves (or across other frequency ranges of interest) over time. Such generalizations may provide some insight into exactly where in the frequency band the accuracy and clarity was better or worse across the frequency spectrum and over the course of a musical (or other audio) selection, though generally with diminished precision.

Audio capture and processing as disclosed herein enable a) recording or capturing audio using equipment and processes that minimize the noted distortion by-products, and b) compensating for noise and/or distortion by manipulating the audio through alteration of the ASDR (preferably differently in different frequency bands, e.g., per octave) to compensate for noise and/or distortion (resulting from, e.g., shortcomings associated with signal capture) or to otherwise adjust according to preferences.

This disclosure describes methods, systems and devices to capture audio sounds more accurately when performing a recording or collecting sounds (e.g., meant for amplification and reinforcement) that minimize distortion by-products in the audio signal as captured.

This disclosure also describes methods, systems and devices to 'fine tune' audio clarity, by frequency octave band (or other frequency band) through manipulation of the captured audio. This fine tuning is performed by addressing the ASDR (which can be done to the listener's preference). ASDR manipulation is accomplished in the frequency domain by altering the ASDR, e.g., in any octave. ASDR manipulation is particularly advantageous when, for example, the audio material was not captured originally using the process disclosed here. ASDR manipulation is also advantageous if the listener (or other editor) chooses to alter the original sound clarity, e.g., based on the qualities prevalent in the particular recording or audio processing chain to which they are listening.

How testing and improving the different components of the recording or capturing audio program material chain to minimize added distortion was accomplished:

Preferably, to capture and/or process streamed audio to maintain the original sound qualities and clarity, each of the components of the audio chain are optimized to avoid inserting distortion into the captured audio signal. (In some embodiments, only some of the audio chain components are optimized as disclosed herein.) This is done by, for example, reducing power supply output impedance of stages in an audio recording/capture chain. Preferably, this includes reducing power supply output impedance and other noise and distortion sources (e.g., as much as possible) at the stages (preferably, each stage) of the capture chain to which access is available, such as from the power input to the microphone(s), through audio recording, monitoring, and playback.

Optimization of stages of an audio recording/capture process is preferably performed in light of resulting differences between the ASDR before and after said optimization (i.e., the change in the spectral dynamic range). The following numbered items and steps are examples, and are preferably used to achieve such optimization.

1) Microphone

The microphone(s) used to capture an audio signal is preferably configured to accurately translate the sound pressure waves into an audio signal that maintains the amplitude and phase relationships of the incoming signals to one another. For example, microphones designed to take accurate measurements of amplitude and phase characteristics of audio samples are typically designed for elevated signal capture fidelity. Accuracy to within +/−1 dB across the frequency band from approximately 4 Hz to 40 kHz can be achieved using high quality measurement-type microphones. Preferably, a microphone should have a very wide dynamic range, preferably 150 dB or more, because human auditory perception can span nearly that dynamic range in some individuals with sensitive hearing capabilities. For example, some microphones from the PCB company demonstrate the desired properties, such as the microphone element 377A06 and microphone preamp body 426A14. Generally, other microphones with similar characteristics will also achieve the audio fidelity characteristics as described.

2) Microphone Holder

Preferably, the microphone holder is made of substantially non-resonant material that will hold the microphone body solidly enough around the microphone body (sufficiently minimizing vibration and other movement of the microphone body relative to the microphone holder) to allow mechanical vibrations received by the microphone body across a wide frequency band to be channeled away to and absorbed by the microphone stand base. The microphone holder is preferably matched to the vibration frequency absorbing capability of the microphone stand so that the microphone will not experience vibrations other than those provided by the acoustic sound pressure wave from the music affecting the captured audio signal. For example, a microphone holder can be made of aluminum to allow successful channeling of microphone body vibrations to the microphone mounting bar and then to the microphone stand assembly. Preferably, a microphone holder is used that enables audio vibrations in the frequency range of the microphone's frequency response to be channeled through the microphone stand assembly to a base that is capable of absorbing and dissipating said vibrations. This vibration channeling helps to limit the effects of acoustically-induced mechanical vibrations of the microphone body on the signal received by the microphone.

3) Microphone Stand

The microphone stand preferably provides acoustic isolation from the floor while absorbing and dissipating mechanical vibrations received by the microphone holder, microphone stand pole pieces, other microphone stand sections, and microphone base to which the microphone stand is connected. The microphone stand can thereby prevent unwanted vibrations (vibrations other than those induced on audio capture elements of the microphone) from modulating the signal captured by the microphone element. A microphone stand designed and built to perform in a manner as described in U.S. Pat. No. 7,017,870 (incorporated herein by reference), for example, can generally be used to capture a substantially unaltered copy of an acoustic pressure wave.

4) Microphone Wire

A microphone wire preferably provides DC power to the microphone and transmits the audio signals captured by the microphone to an audio capture/recorder device with minimum group delay and minimum phase delay across an audio band from approximately 4 Hz to 100 kHz. This helps to minimize smearing of the transients of the audio signal. Smearing of audio signal transients generally results in low level distortion energy in between audio signal frequency peaks. For example, Sound String Silver balanced interconnect/microphone wire is capable of providing both minimal group and phase delay across the 4 Hz to 100 kHz band when properly conditioned prior to use in capturing the desired audio signals; proper conditioning of microphone wire is further explained in item 6) below.

5) Running the Microphone Wire to the Audio Recorder

The microphone wire connecting the microphones to the audio recorder/capture device should not be held or clamped to the microphone stand because the proximity of the cables to the metal of the microphone stand causes a degradation of the group and phase delay, as does laying the microphone wire on metal flooring or concrete flooring. Preferably, foam standoffs (or standoffs with similar dielectric properties) are used to separate the microphone wire from the microphone stand, thereby reducing group delay and phase delay caused by proximity between the microphone(s) and the base of the microphone stand when running the microphone wire down the microphone stand. To avoid laying the microphone wire directly on a metal or concrete flooring surface, the microphone wire is preferably laid on a wooden floor surface, or suspended above the flooring surface using wooden standoffs. This reduces flooring-induced group and phase delay, and enables a more accurate signal to be transmitted from the microphone(s) to the audio recording device. Other materials with dielectric properties similar to those of wood can also be utilized to reduce signal degradation.

6) Conditioning the Microphone Wire, after Connection Between the Microphones and the Audio Recording/Capture Device, to Provide Minimum Signal Group and Phase Delay The dielectric material that surrounds the microphone wire conductors inside the microphone cable has characteristics that change depending on how recently signal was sent through the cable, as well as on the harmonic content of the signal most recently passed. Typically, after no signal has been present on a microphone wire for an extended amount of time (approximately one day), the wire reaches a state that causes smeared audio transients as a result of poor group and phase delay characteristics of the settled/desensitized dielectric material. The steady state propagation characteristics of the microphone cable after a lengthy time of signal passage with significant harmonic content of high level across the desired audio spectrum (~4 Hz to 100 kHz) can be approximated by sending a series of impulse-like signals with broad frequency content through the cabling shortly after it has been deployed between the microphone(s) and microphone stand, and the audio capture device. For example, striking together vigorously two ¾ inch thick plywood pieces, approximately 14 inches by 14 inches square, provides an impulse-like signal with broad frequency content that can hasten the dielectric break in time to allow the dielectric material in the microphone wire to attain substantially steady state frequency propagation characteristics of reduced group and phase delay; generally, this step can be completed in the amount of time taken to strike the boards together approximately 20 times. This enables an audio recording/capture process, shortly after the audio capture system has been assembled, that emulates the original pressure wave(s) from the acoustic audio signals present at the event with high fidelity. Conditioning the microphone wire in this manner avoids a lengthy wait while the microphone wire dielectric stabilizes without assistance from an impulse-like signal, e.g., while audio program material is passed through the cable.

7) Microphone Preamp/Analog to Digital Conversion/Digital Audio Signal Recorder (Audio Recording/Capture Device)

Power supply design philosophy, power supply circuit design, quality of the component parts of the audio power supply, analog to digital converter design philosophy, the analog to digital converter circuit design, the quality of parts of the analog to digital converter, and the physical layout of the power supply and analog to digital converter interconnections are together defined herein as the "Power Supply Assembly" or "PSA". The PSA is preferably selected to minimize noise and distortion transfer from the power supply, oscillator and clock circuits, and digital output signal processing chips, to the analog and digital audio signal paths. This increases the "spurious free dynamic range" of the combined circuits. Spurious free dynamic range is the amplitude range (peak to minimum) over which an amplified test signal, as amplified by the amplifier circuit being tested, does not have added noise and distortion byproducts.

Preferably, the spurious free dynamic range of the PSA is 130 dB or more, which is within the spurious free dynamic range capabilities of some available converters and recorders. Preferably, an audio recorder with a high spurious free dynamic range is used (selected) to provide power to the microphones, analog to digital converter circuits, and digital output circuitry that is substantially free from distortion and noise caused by other signals in the audio recording device; for example, the Nagra Seven digital audio portable digital audio recorder (which also accepts an outboard power supply to continuously charge its internal batteries as well as provide power for circuit operation). External power supplies can be used—for example, in place of internal power supplies which have a low spurious free dynamic range.

8) Monitoring (if any) of the Recorded/Captured Audio Signal Using an Audio Monitoring device independent of and not directly connected to the audio recording Device Preferably, a digital to analog converter and/or amplifier for headphone or 'line out' monitoring is used which does not share a power supply with the audio recorder/capture device. External audio monitoring of the audio recorder/capture device input signal is preferably made using an external digital to analog converter/headphone amplifier that receives an AES/EBU digital audio signal buffered by a transformer-based signal isolation device to reduce the degree to which digital and analog noise from an external headphone amplifier device affects the audio capture/recording device power supply lines and ground line. Such noise can raise the noise floor and thereby reduce the spurious free dynamic range of the recording device. The dsmb tech company, for example, manufactures a digital audio isolation transformer device, Model ADIT010X (designed for a 50 MB/s data rate), that works well for this purpose.

9) Cabling for Connection from the Audio Recording Device to the Independent Audio Monitoring Device Digital audio cables for balanced AES/EBU digital audio transmission preferably have an impedance selected to minimize reflections and maximize energy transfer between the digital audio recording device, the digital audio isolation device, and the independent headphone amplifier device to enable maximum fidelity and minimum interference; for example, a cable from the van den Hul company of the Netherlands, model McAu ('Mc Gold'), has those characteristics.

10) Utilization of Internal Power Conditioning for the Audio Recording Device and the Independent Audio Monitoring Device Preferably, noise signals in the power supply lines of the audio recording/capture device and the independent audio monitoring device are converted into DC power. This can substantially reduce (or eliminate) internally generated noise signals, increasing the spurious free dynamic range of noise-reduced devices. Such noise reduction can be performed by, for example, the CC-100 integrated circuit (mounted in a USB dongle), designed by Michael Hopkins of the CurrentRF company. See also PCT App. No. WO2015119916, which is incorporated herein by reference. The CC-100 captures and recycles CMOS logic dynamic current for purposes of system power reduction, and also reduces the noise on internal power supply lines, lowering the noise floor and thereby increasing spurious free dynamic range.

11) Utilization of external electromechanical interference shielding structure on the Audio Recording/Capture Device and the Audio Monitoring Device to Absorb Radio Frequency Noise and Thereby Increase the Spurious Free Dynamic Range of the Audio Capture/Recording Device and Independent Audio Monitoring Device Circuits internal to the audio recording device and the audio monitoring device generate high frequency computer clock related and radio frequency noise. This noise can be absorbed and dissipated through the use of, e.g., parallel plates of carbon fiber or carbon fiber nanotubes placed around the audio recording device and the audio monitoring device as explained in U.S. Pat. No. 8,520,406, incorporated herein by reference. Film thickness, spacing between layers, and the number of layers is preferably selected to maximize noise absorption over the desired frequency range (corresponding to, e.g., audio frequencies and computer clock frequencies in the audio capture/recording and independent monitoring devices). For example, carbon fiber layer thickness between 0.5 and 1 mm, layer spacing between 3 and 4 mm, and 3 or 4 layers. This noise absorption reduces the electromagnetic interference associated with typical audio capture/recording and playback devices, and therefore increases their spurious free dynamic range.

13) A/C Mains Power Filtering for Power Supplies of the Equipment in Items 7 and 8

Equipment that draws power from the A/C power plugs in a building will generally add noise back onto the A/C power lines. This noise will generally be present in A/C power contemporaneously drawn by other equipment in the same building. This noise is preferably filtered out from A/C power drawn by the audio recording/capture device and the audio monitoring devices to keep the noise from reducing the spurious free dynamic range and limiting the transient response of captured audio. Some A/C power filters apply passive components to the input power lines of power filter boxes. While passive filters may reduce noise in A/C power at certain frequencies, they also generally increase the output impedance of the filtered A/C power. Increased impedance on incoming power lines can result in different frequency bands being amplified differently (depending on, e.g., which frequency bands have increased impedance). A power isolation transformer, however, can pass power (substantially) equally across the audio spectrum while isolating the audio recording/capture device and the audio monitoring device from the noise on the A/C power input lines. For example, the Plitron company's Torus Power Toroidal Isolation Power Transformers, such as the RM15 and Tot Mini lamp models, can be used for noise isolation and low impedance output power over audio bands typically used by audio recording/capture devices and audio monitoring device equipment as disclosed herein.

14) Headphones and/or Earbud Requirements to Enable Successful Recognition of Changes and Dynamic Range Improvements in the Recording/Capture Chain Preferably, highly accurate playback transducers and digital to analog converters are used to enable the recording/capture process developer to hear small changes in the noise floor and transient response. Typically, over the ear headphones and in the ear 'earbuds' are designed with a 'target sound' that (often purposely) does not correspond to accurate sound reproduction. Preferably, headphones or earbuds are used which accurately reproduce recorded sound, enabling a recording/capture process developer to determine whether candidate changes in the recording chain improve or degrade recorded/captured sound. For example, the frequency response and acoustic isolation characteristics of the Technics Panasonic EAH-T700 over the ear headphones and the Reed Heath Acoustics RHA CL1 earbuds provide accurate sound reproduction over a wide frequency and dynamic range, enabling a development engineer to hear subtle changes in the recording chain and determine if they improve or degrade audio quality.

15) Characteristics of a High Resolution Audio Player that is Able to Accurately Reproduce the Recorded/Captured Sound Preferably, a high resolution audio player has high spurious free dynamic range and minimal (e.g., vanishingly small or no) output impedance in its power supply. The Questyle company's QP1-R model, for example, possesses these characteristics, enabling its use to determine whether changes in the audio recording/capture process improve or degrade the accuracy of sound capture. Use of the QP1-R player with the EAH-T700 headphones is preferred. Another example of a player with the described characteristics is the Astell & Kern company's model AK120 Mk II.

Listeners sensitive to alterations in the Audio Spectral Dynamic Range of audio program material that differs from the original audio events can recognize that distortions are present, although limitations due to lack of clarity in captured or recorded music can result in other forms of distortion masking ASDR-related issues. The ability to perceive differences between high ASDR and low ASDR audio samples, both qualitatively through cognitive hearing and quantitatively through comparison of frequency domain plots of music recorded using the process disclosed hereinabove and music recorded using other techniques, has enabled an understanding of the differences in audio recording and capture processes. This understanding has further enabled the development of processes for adjusting audio recordings or captures made with relatively poor ASDR to have characteristics more like audio recordings or captures using the techniques disclosed herein.

FIG. 4A shows an example of a spectrogram 400 (frequency domain analysis) of a prior art recording of an audio program material. FIG. 4B shows an example of a spectrogram 402 of a recording of the same audio program material as in FIG. 4A. The recording of FIG. 4B was made using the techniques described above for optimizing an audio recording/capture chain to improve ASDR in a resulting audio recording. (FIGS. 4A, 4B, 5A, 5B, 6A, and 6B are greyscale images generated from color spectrograms, in which color indicated amplitude.) Audio distortion caused by the recording and playback chain is visible as a "smudging" in the spectra visible in FIG. 4A. For example, in FIG. 4A, individual energy peaks 404 (distinct lines corresponding to as-performed high frequency notes) and vibrations of the energy peaks 404 (small variations in frequency on individual energy peaks 404) are difficult to resolve, while in FIG. 4B, the same individual energy peaks 406 (the same notes) and vibrations within energy peaks 406 are readily distinguishable. This "smudging" reduces the ASDR of the audio recording of FIG. 4A.

The dark spaces in between the energy peaks 402, 404, 502, 504, 602, 604 in FIGS. 4A, 4B, 5A, 5B, 6A, and 6B (respectively) correspond to energy troughs (valleys).

High frequency notes 404 in FIG. 4A help to demonstrate that, in spectrograms of prior art recordings, extra sounds (audio energy in frequencies not corresponding to the program material as played) become visible as a blurring or smearing of audio energy into frequency ranges between energy peaks 404. This makes energy peaks 404 and their vibrations more difficult to clearly see (and in playback of the corresponding recording, more difficult to clearly hear). In contrast, FIG. 4B shows that generally, in spectrograms of recordings using techniques for improving ASDR as described herein, high frequency notes 406 show fewer (or no) extra sounds, or extra sounds with significantly lower amplitude, than in prior art spectrograms of recordings of the same audio program material; and energy peaks 406 and their vibrations are more clearly visible (and in playback, more clearly audible).

Note that 'dither' 408 has been added to the prior art recording of FIG. 4A. Dither 408 is visible in the high(est) frequency regions of the frequency analysis of FIG. 4A. Dither was not added to the recording used to generated the frequency analysis of FIG. 4B. Dither typically masks clarity of energy peaks and nearby frequencies. Dither is a processing technique typically performed to compensate for truncation of data bits in a final audio output.

FIG. 5A shows an example of a spectrogram 500 (frequency domain analysis) of a prior art recording of a relatively high energy amplitude (high level) audio program material. FIG. 5B shows an example of a spectrogram 502 of a recording of the same audio program material as in FIG. 5A. The recording of FIG. 4B was made using the techniques described above for optimizing an audio recording/capture chain to improve ASDR in a resulting audio recording.

As shown in FIG. 5A, increased audio program level (energy amplitude) makes more energy available to be converted into distortion by-products of the audio recording equipment chain. (Level corresponds to measurable/objective amplitude, in contrast to volume, which corresponds to perceived amplitude.) These distortion by-products are generally located in the frequency regions between the energy peaks of the audio program material as originally played (the original audio events), typically resulting in lower ASDR in prior art high-level audio program material. Distortion is relatively severe in FIG. 5A, such that as-performed energy peaks 504 (lines showing distinct frequencies, corresponding to notes played instruments and respective harmonics) are largely obscured. In contrast, in FIG. 5B, the same as-performed energy peaks 506 (notes and harmonics) are readily visible. This corresponds to a real, audible difference in the audio program material as recorded (depending on individual capacity to hear ASDR, which varies from person to person, and on quality of playback equipment).

Figure 6A:
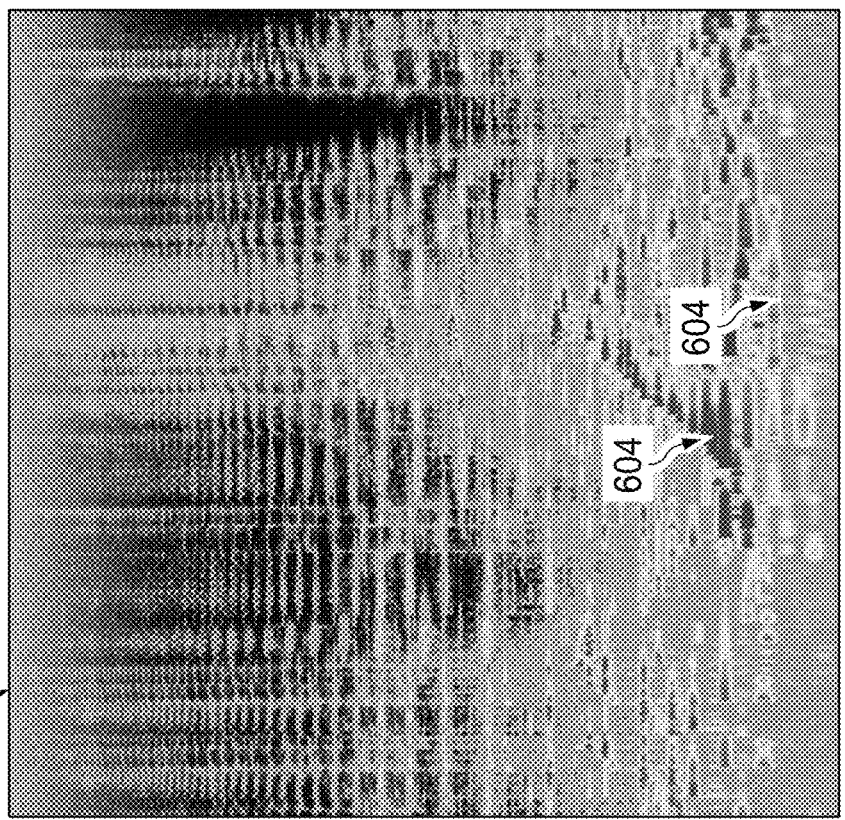
FIG. 6A shows an example of a spectrogram of a prior art recording of an audio program material.

FIG. 6A shows an example of a spectrogram 600 (frequency domain analysis) of a prior art recording which includes relatively high energy amplitude (high level) audio program material. As shown in FIG. 6A, in a particularly high-volume portion 604 of the program material, it can be difficult to determine at what frequencies notes were played during the audio event (the performance).

FIG. 6B shows an example of a spectrogram 602 of a recording of the same audio program material as in FIG. 6A. The recording of FIG. 6B was made using the techniques described above for optimizing an audio recording/capture chain to improve ASDR in a resulting audio recording. Energy peaks in loud portions 606 in FIG. 6B are clearly visible. As shown in FIG. 6A, low frequency notes can be indistinct and smeared in (even high definition) prior art recordings produced using a close microphone technique intended to capture clean, clear sounds. However, as shown in FIG. 6B, low frequency notes are loud, well defined, and distinct from each other in audio program material produced using recording/capture techniques and equipment for improving ASDR as described herein. ASDR improvement resulting in sounds which are perceived to be more distinct and louder can be achieved using the above-described methods and apparatus even when using a distant microphone technique. This is true despite distant microphone techniques typically being associated with less distinct and quieter sounds (with respect to both objective and perceived amplitude) because of the increased distance between the instruments and the microphones. This reinforces the point that increased ASDR can increase perceived amplitude even when objective/measured amplitude is decreased (or can compensate for a decrease in objective/measured amplitude).

In FIGS. 4A, 4B, 5A, 5B, 6A and 6B, the vertical axis corresponds to frequency in Hz (cycles/second), and the horizontal axis corresponds to time (seconds). The audio recordings of FIGS. 4A, 5A, and 6A were performed using prior art methods, and are taken from a high resolution digital recording from a major recording label. The audio recordings of FIGS. 4B, 5B, and 6B were performed using recording techniques selected to improve ASDR, as described herein. The program material selected is sufficiently complex in harmonic structure to show ASDR-related detail at various frequency bands and amplitudes, and comprised of sufficiently few instruments to limit the amount of spectral content and thereby avoid obscuring ASDR-related differences.

As shown in FIGS. 4A, 5A, and 6A, when degraded clarity is present the audio signal's frequency components are "smeared out" in frequency, corresponding to a smeared appearance in respective spectrograms. Some lower level principle frequency components are smeared out such that they are difficult to distinguish (both visually and aurally). The main frequency components of the audio signal are generally present (at a slightly lower level than expected when compared to the acoustic event as-performed), but there is also low level musical information in between the main frequency components that was not present in the original acoustic event. That is, some audio content is present where no notes were played, and harmonic information is now present where harmonic information did not exist in the original acoustic event (the performance). These recording artifacts are apparent by comparison with the spectrograms of FIGS. 4B, 5B, and 6B, which were made using the innovative recording/capture techniques for improving ASDR described herein.

The "smearing out" of the frequency content in the prior art recordings (FIGS. 4A, 5A, 6A) is due to some of the energy of the captured audio signals spreading into frequency bands adjacent to primary frequency components of the original acoustic event. That is, energy which was present in audio frequency energy peaks of as-performed sound (as originally present in the program material as it was performed during recording/capture) is lost to distortion introduced by the recording/capture process; some smeared out energy also ends up in different energy peaks than were present in the original audio event. As a result, the spectrograms of FIGS. 4A, 5A, and 6A show audio energy in frequency bands where no (or less) audio energy is present in the spectrograms of FIGS. 4B, 5B, and 6B. The "smearing out" shown in FIGS. 4A, 5A, and 6A thus lowers the Audio Spectral Dynamic Range (ASDR) of the recorded signal such that energy peaks 404, 504, 604, surrounded by energy lost to adjacent frequencies, are no longer as clearly defined. This represents a real loss in sound quality, an audio degradation analogous to erosion raising valley floors (troughs), reducing mountain peaks (energy peaks), and smoothing sharply-defined features. The lowered ASDR results in a loss of accuracy, clarity, dynamic impact, and subtle (or other) acoustic details.

In addition to lowering ASDR using recording/capture techniques and equipment chain components as described above, distortion present in audio recordings (and/or audio signal captures) can also be addressed by adjusting the spectral dynamic range of an audio recording (or signal capture) to preference. Audio processing in the frequency domain (as described herein) can be accomplished to alter the ASDR of the captured audio signal in selected frequency octave bands to provide increased clarity and dynamic range, and a natural-sounding result (generally, increased ASDR); or to provide decreased clarity and dynamic range, and a more 'processed' and denser sound (generally, decreased ASDR). ASDR can also be increased in some frequency bands while being decreased in others. Changes in ASDR can also be made dependent on levels (amplitudes) of sounds in the target audio program material; for example, ASDR can be increased for louder sounds more (or less), while ASDR can be increased for quieter sounds less (or more).

FIG. 7A shows an example of a sound spectrograph 700 of an audio program material. FIG. 7B shows an example of a sound spectrograph 702 of the audio program material of FIG. 7A after ASDR adjustment. As shown in FIG. 7B, amplitude peaks 704 (energy peaks) have been unaffected, while troughs 706 between the peaks 704 have been raised (added decibels, at approximately 1200 Hz, 650 Hz, and 1000 Hz), lowered (subtracted decibels, at approximately 450 Hz, 800 Hz, and 2000 Hz), or left unchanged (at approximately 3000 Hz and 16000 Hz). Raising troughs decreases ASDR, lowering troughs increases ASDR, and leaving trough levels unchanged leaves corresponding local ASDR (local to the particular (un)adjusted frequency region) unchanged. These changes can also be made by adjusting multiple data points at the same time, e.g., using a sound spectrogram. Views of spectrograms using increased detail and granularity of amplitude indications can assist in determining where energy peaks and troughs are properly located, and in identifying targets for adjusting trough levels (amplitudes).

Increasing or decreasing ASDR can improve (or worsen, or otherwise alter) audio clarity. (Qualitative assessment of desirability of particular ASDR changes has been found, anecdotally, to be a matter of personal taste.) Increases in ASDR correspond to an increase in audio program information content, and decreases in ASDR correspond to decreases in audio program information content.

Alteration of the spectral dynamic range of the desired audio signal can be accomplished in, for example, real time (i.e., processing during audio recording/capture), or after the sounds have been captured and recorded (e.g., in a batch mode; this can be useful, for example, to enable preserving captured audio in its original form, and later processing the audio and recapturing it for comparison to the unprocessed audio).

ASDR increases (or other changes) during post-recording processing can be used to help compensate for distortion which will (generally) be introduced by playback equipment. ASDR can also be adjusted during the playback process. Consequently, configuration of ASDR adjustment preferences (such as definition of ranges of frequency bands and/or amount of adjustment to be made per frequency band) can be made available to end users so that ASDR adjustment can be made according to individual listening preferences.

Figure 8:
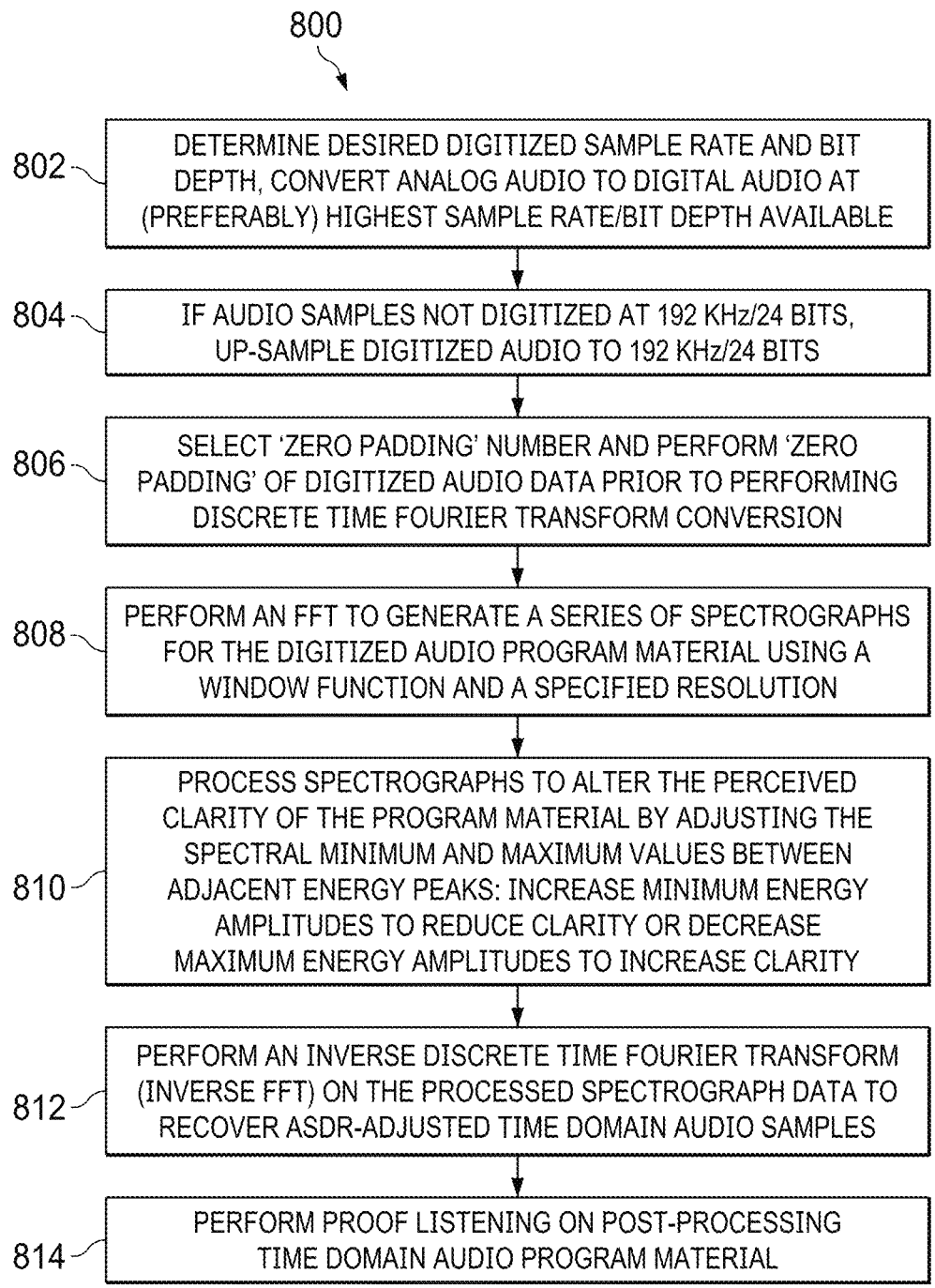
FIG. 8 shows an example of a method for adjusting the Audio Spectral Dynamic Range of a captured audio program material.

FIG. 8 shows an example of a method for adjusting the Audio Spectral Dynamic Range of a captured audio program material 800. The Fast Fourier Transform (FFT) algorithm is used for this purpose; those of ordinary skill in the art of audio signal processing will understand that various other computational and algorithmic tools can be used (e.g., to convert a time-domain representation of a recorded audio program material to a frequency-domain representation of the recorded audio program material). Preferably, as shown in FIG. 8, the following steps are used to adjust ASDR.

1) In step 802, either determine the sample rate and bit depth of the audio program material to be processed; or, if the audio program material is in analog form (not yet in the digital domain), convert the audio program into the digital domain, preferably using the highest bit rate and sample rate available and the most accurate analog to digital conversion device available. Higher bit rate and sample rate, and more accurate analog to digital conversion, will generally enable higher ASDR (and, generally, better accuracy) in the processed audio program material.

2) Preferably, if the program material was not digitized at 192 kHz/24 bits or higher, up sample the program material to the highest sample rate possible with the equipment available in step 804.

3) Add a number of zero-valued samples to the data samples in the digital audio program material, the number of zero valued samples to be added corresponding to a selected 'zero padding' value in step 806. Zero padding is used to enable use of certain types of fast Fourier transforms, and to help isolate data sample sets from each other to reduce spectral leakage.

The zero padding value is preferably selected such that:
zero padding value=$2^{(ceiling(\log_2(sample\ bit\ length))+1)}$−sample bit length "Ceiling" corresponds to always rounding up, and "sample bit length" is the number of bits in an audio data sample (the smallest packet of audio information, like a pixel for picture information). The equation above gives a zero padding value such that a data sample's bit length is increased to equal an integer power of two that is at least double the original length. For example, if the original bit rate is 24 bits, then the zero padding value is 40, so that the total zero-padded length is 64 bits. Zero padding can be performed, for example, for the data samples in the audio to be processed in a 'batch mode', or one at a time if the processing is accomplished one cycle at a time (e.g., for real time processing).

4) Using the digitized, up-sampled, zero-padded audio data, convert the audio data from the time domain into the frequency domain (such as by using a discrete-time Fourier Transform, particularly a Fast Fourier Transform, or FFT), and generate one or more (preferably, a series of) spectrographs for the program material using the transformed audio data in step 808. Preferably, the Blackman window function is used, in conversion from the time domain to the frequency domain, to generate frequency domain data which can be displayed as a spectrograph. Generally, the Blackman window function results in the least sample-to-sample overlap, which yields a more accurate representation of the spectral frequency content.

Spectrographs preferably have at least a 5 Hz resolution across the frequency band to enable a high resolution adjustment of spectral values. This points to a reason that up-sampling of the original audio program material (as described above) is preferred. A tradeoff exists between the desired frequency resolution and the amount of audio program material that is utilized in the spectrograph conversion process. Higher frequency resolution corresponds to an increased number of samples used per time period (within the audio program material) by the process of generating spectrographs using FFT frequency domain conversion. If there are insufficient samples to generate spectrographs using the specified frequency resolution, then spectrograph data may be distorted (typically, a smearing effect) in the frequency domain, limiting accuracy of further processing. This type of distortion is an artifact of the spectrograph generation process, and is caused by violating a requirement of the spectrograph generation algorithm: the program material to be analyzed should be short term stationary with respect to the length of the analysis window. Up sampling limits and/or substantially reduces effects of this issue.

Further with respect to short term stationarity, discrete time Fourier transform analysis accuracy depends on the idea that the signal(s) being analyzed are periodic signals to enable a perfectly accurate frequency domain representation of the time waveform under investigation. Given that real life music and other speech time audio signals are not (perfectly) periodic, some assumptions can be made to enable a reasonable compromise between the perfect accuracy of a periodic time domain signal's representation in the frequency domain, and a less than perfect (e.g., realistic) frequency domain representation of a non-periodic signal. The compromise is that the time domain signal under analysis should be relatively constant over a short period of time where the frequency domain conversion is to be performed. The signal processing term for this situation is 'short term stationary with respect to the FFT analysis window time'. The FFT analysis window time is the amount of time analyzed in the FFT data analysis function. For example, FIGS. 4A, 4B, 5A, 5B, 6A, and 6B consider 1 second periods of time for FFT analysis, so the signals of interest are approximately short term stationary because they do not change much over a 1 second time window.

5) The regions between adjacent pairs of energy peaks (spectral peaks) in a spectrograph are referred to as 'valleys' or 'troughs' herein. Once spectrographs have been generated for the samples of digitized audio, the spectrographs are processed by adjustment of the spectral value in the valleys shown in the spectrograph in step 810. This is preferably performed across the entire frequency spectrum of interest (it can also be performed for selected frequency bands), working with spectral peaks in the program material in pairs (i.e., valley by valley). A change in level for a set of data points in a valley can be accomplished by a) increasing the energy amplitude (level) of audio data points in the valley by a specified amount (to decrease signal clarity), or b) decreasing the energy amplitude (level) of audio data points in the valley by a specified amount (to increase signal clarity). (Increases and decreases of energy amplitude can, for example, be absolute changes in amplitude and/or create or change the level of a desired amplitude curve.) Preferably, ASDR-related adjustment amplitude of energy peaks corresponding to frequencies in a performance or generation (e.g., computer generation) which was captured to create the audio program material is avoided. Processed spectrographs are preferably stored to a new file that holds the adjusted ASDR signal for one cycle of the process. The ASDR-adjustment process is preferably used (repeated) to process the spectrographs in a digitized audio program material of interest.

These adjustments can be performed, for example, immediately after the spectrograph has been generated for the audio data sample and before it is stored as a processed sample in an output audio file, or on a series of stored spectrographs (e.g., if the signal processing to be performed across the frequency range of the spectral content is known from prior experimentation). In some embodiments, a pre-determination may be made of a range of frequencies to which a fixed amount of spectral value increase or decrease will be applied. This can be useful when, for example, perceptually significant changes are found to have similar effects across relatively broad frequency bands. For example, processing can use the same (or similar) value of spectral valley data point amplitude increase or decrease for relatively broad groups of frequencies like low bass, mid bass, high bass, low midrange, midrange, high midrange, low treble, mid treble, and high treble regions.

The user could, for example, be presented with a set of knobs and/or sliders (or other control interfaces), e.g., one or more for each frequency band to be processed at the same spectral valley increase or decrease (or same coefficients of a function controlling increase or decrease). There can be calibrated values for increase or decrease of spectral valley numbers (e.g., in decibels, or dB) to assist with the 'tuning effort' and facilitate relatively quick determination of the optimal values for a particular program material or type of program material. Preferably, candidate changes in spectral dynamic range for different parts of the frequency spectrum could be made in real time so the user could listen to the result (by way of a conversion back to an analog signal as processing is happening) and decide on optimal values for spectral ranges as the conversion from digital audio files is made to spectrographs for processing and storage of results.

6) In step 812, once spectrograph processing is completed, (1) perform an inverse discrete time Fourier Transform (inverse FFT) on the stored suite of updated spectrographs to recover the ASDR-adjusted audio samples back into the time domain, (2) perform down-sampling (if applicable) to return the audio program material to its original sample rate, and (3) remove the zero padding. Zero padding can be removed by truncation of the transformed time domain audio data back to the original sample rate bit depth.

It is useful to test the processing chain initially by listening to post-processed digitized time domain audio samples after applying a digital to analog conversion on the ASDR-adjusted samples to confirm that the resulting audio program material has been changed as desired and expected (in light of monitoring during the adjustment process) in step 814. If the user hears results that replicate those heard during a 'real time' spectral adjustment process, the processing chain can generally be considered properly setup and functional. If the user has accomplished the spectral dynamic range tuning in 'batch mode', the playback of the time domain digital audio samples into the analog domain can comprise a trial sample processing pass at spectral tuning to the user's preference. Further ASDR tuning passes may be used to optimize processing across the frequency bands of interest.

Modifications and Variations

As will be understood by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

In some embodiments, a sample rate of 192 kHz/24 bits resolution is a minimum sample rate for high accuracy processing.

In some embodiments, a sample rate and/or bit depth less than the highest available is used during digital conversion and/or ASDR processing. In some embodiments, other sample rates and/or bit depths are selected.

In some embodiments, a Harris, Triangle, Hamming or other window function can be used in generating spectrographs.

In some embodiments, some regions between spectral peaks (valleys) can be left unchanged.

In some embodiments, a minimum amplitude of data samples in a valley (or set of valleys) can be increased to decrease signal clarity. In some embodiments, a maximum amplitude of data samples in a valley (or set of valleys) can be decreased to increase signal clarity.

In some embodiments, increases or decreases in (audio energy) amplitude of data points in valleys between spectral peaks can be uniform, or according to a function (e.g., frequency-dependent and/or time-dependent), or can be greater or lesser depending on the respective amplitudes of the data points. In some embodiments, other characteristics of an audio program material (such as amplitude or frequency trends over time) can be used to determine amounts and/or directions of ASDR changes for various frequency bands. In some embodiments, frequency bands in which similar ASDR changes are made are defined in dependence on whether mutually proximate frequencies have similar amplitudes.

In some embodiments, processing software automatically detects spectral peaks and valleys and applies specified ASDR adjustments to individual valleys or groups of valleys (e.g., valleys within a frequency band, such as low mid bass). In some embodiments, automatic ASDR adjustment (without a user interface for configuration of automatic ASDR adjustment parameters) is implemented in hardware, such as a custom integrated circuit.

In some embodiments, an interface enabling ASDR adjustment to frequency bands in the same way across particular frequency bands can enable adjustments to the width and location of the frequency bands to be adjusted in the same way.

In some embodiments, energy peaks do not include local maximum-amplitude frequencies when there was silence (or no or minimal audible sound) in the audio event the program material as originally played or generated). For example, in some embodiments, data samples in a frequency domain digital audio program material can be excluded from energy peaks when they have less than a specified amplitude.

In some embodiments, ASDR adjustment is performed locally to an energy peak without adjusting other energy peaks. In some embodiments, for an energy peak to be adjacent to another energy peak, it must be within a certain number of Hz of the other energy peak. In some embodiments, ASDR is adjusted locally to energy peaks that do not have adjacent energy peaks (i.e., when there is no valley).

In some embodiments, "energy peaks" (or "audio spectral peaks") of a signal can be determined with respect to a given time mark in an audio signal within a digitized audio sample set, rather than with respect to the digitized audio sample set.

In some embodiments, zero padding is not performed.

In some embodiments, an audio program material is computer generated. In some embodiments, an audio recording is played and the resulting sound is captured to produce an audio program material (rather than, for example, live-performed using instruments and recorded). Note that processing of computer generated audio material can (and generally does) introduce distortion.

In some embodiments, ASDR of an audio program material to be played over a public address system is increased to improve sound quality of the audio program material as played over the public address system.

In some embodiments, the captured audio program material is initially in an analog format, and the captured audio program material is converted to a time domain digital format prior to performing ASDR adjustment.

In some embodiments, amplitudes of energy troughs within a predetermined frequency band, and/or which are within a predetermined amplitude range, or which are within a predetermined range of amplitude difference (absolute or proportional) from corresponding adjacent energy peaks, are adjusted by a same amount.

In some embodiments, captured audio program material is written to a non-transient memory. In some embodiments, audio program material which has been converted to a frequency domain is written to a non-transient memory. In some embodiments, ASDR-adjusted time domain audio program material is written to a non-transient memory. In some embodiments, a non-transient memory can be, for example, a cache, a hard drive, a flash memory stick, a CD or DVD, or other storage medium.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method of processing an audio program material, comprising the actions of:
   a) converting the audio program material into a frequency domain audio program material;
   b) increasing or decreasing an energy amplitude of one or more energy troughs in an audio data sample in the frequency domain audio program material, ones of the energy troughs being located between pairs of energy peaks adjacent to respective ones of the energy troughs in the audio data sample, the pairs of adjacent energy peaks selected to correspond to frequencies of sounds which were captured to create the audio program material, wherein energy amplitudes of the energy peaks are held constant during the increasing or decreasing
   c) repeating the step b) for multiple audio data samples in the frequency domain audio program material; and
   d) converting the frequency domain audio program material into a time domain audio program material.

2. The method of claim 1, further comprising playing the time domain audio program material to generate audible sound.

3. The method of claim 1,
   wherein a discrete-time Fourier transform is used to convert the audio program material into the frequency domain audio program material, and
   wherein an inverse discrete-time Fourier transform is used convert the frequency domain audio program material into the time domain audio program material.

4. The method of claim 1, wherein a minimum amplitude of the energy troughs is increased, or a maximum amplitude of the energy troughs is decreased.

5. The method of claim 1, further comprising not changing, between step a) and step d), amplitudes of the energy peaks.

6. The method of claim 1, wherein the audio program material is converted from an analog format to a time domain digital format prior to step a).

7. The method of claim 1, wherein the audio material is upsampled to a sample rate of at least 192 kHz at a bit depth of at least 24 bits prior to step a).

8. The method of claim 1, wherein "bit length" is the bit length of data samples in said audio program material, further comprising zero padding data samples of the audio program material with at least $(2^{\lceil \log_2(\text{bit length}) \rceil}+1)-\text{bit length}$ zeroes prior to step a).

9. The method of claim 1, further comprising, prior to step b), automatically detecting frequencies at which the adjacent pairs of energy peaks and the energy troughs are located.

10. The method of claim 7, wherein amplitudes of energy troughs within a predetermined amplitude range, or within a predetermined range of amplitude difference from corresponding pairs of adjacent energy peaks, are increased or decreased by a same amount.

11. The method of claim 7, wherein amplitudes of energy troughs within a predetermined frequency range are increased or decreased by a same amount.

12. The method of claim 11, wherein said predetermined frequency range comprises at least one of: low bass, mid bass, high bass, low midrange, midrange, high midrange, low treble, mid treble, and high treble.

13. The method of claim 1, wherein amplitudes of energy troughs at different frequencies are increased or decreased by different amounts.

14. The method of claim 1, wherein amplitudes of energy troughs at different amplitudes are increased or decreased by different amounts.

* * * * *